United States Patent
Jo et al.

(10) Patent No.: US 12,449,401 B2
(45) Date of Patent: Oct. 21, 2025

(54) APPARATUS AND METHOD FOR INSPECTING ELECTROSTATIC CHUCK FOR SUBSTRATE PROCESSING

(71) Applicant: SEMES CO., LTD., Cheonan-si (KR)

(72) Inventors: Mi Young Jo, Hwaseong-si (KR); Choong Moo Shim, Hwaseong-si (KR); Young Ran Ko, Daegu (KR)

(73) Assignee: Semes Co., Ltd., Chungcheongnam-do (KR)

( * ) Notice: Subject to any disclaimer, the term of this patent is extended or adjusted under 35 U.S.C. 154(b) by 372 days.

(21) Appl. No.: 18/069,400

(22) Filed: Dec. 21, 2022

(65) Prior Publication Data
US 2023/0213483 A1 Jul. 6, 2023

(30) Foreign Application Priority Data
Dec. 31, 2021 (KR) .................. 10-2021-0193593
Oct. 11, 2022 (KR) .................. 10-2022-0129378

(51) Int. Cl.
| | |
|---|---|
| G01N 29/06 | (2006.01) |
| G01B 17/02 | (2006.01) |
| G01N 29/28 | (2006.01) |
| H01L 21/683 | (2006.01) |

(52) U.S. Cl.
CPC .......... *G01N 29/069* (2013.01); *G01B 17/02* (2013.01); *G01N 29/28* (2013.01); *H01L 21/6833* (2013.01); *G01N 2291/0231* (2013.01); *G01N 2291/0289* (2013.01)

(58) Field of Classification Search
USPC .......................................................... 73/627
See application file for complete search history.

(56) References Cited

FOREIGN PATENT DOCUMENTS

| | | | | |
|---|---|---|---|---|
| JP | 6152272 B2 | * | 6/2017 | |
| JP | 2021-087106 A | | 6/2021 | |
| TW | 201219890 A | * | 5/2012 | .......... G02F 1/1303 |
| TW | 1608303 B | * | 12/2017 | |
| TW | 202328752 A | * | 7/2023 | ......... G02B 26/0858 |

* cited by examiner

*Primary Examiner* — Walter L Lindsay, Jr.
*Assistant Examiner* — Warren K Fenwick
(74) *Attorney, Agent, or Firm* — Harness, Dickey & Pierce, P.L.C.

(57) ABSTRACT

The apparatus for inspecting the electrostatic chuck for substrate processing includes the electrostatic chuck including a ceramic layer and an electrode layer coupled to an inside of the ceramic layer, an ultrasonic sensor unit disposed on the electrostatic chuck, allowing an ultrasonic wave to be incident into the electrostatic chuck, and converting a reflected signal reflected through the electrostatic chuck into an ultrasonic voltage signal, and an ultrasonic inspection unit to divide the ceramic layer and the electrode layer, based on a size value of the ultrasonic voltage signal.

12 Claims, 5 Drawing Sheets

APPARATUS AND METHOD FOR INSPECTING ELECTROSTATIC CHUCK FOR SUBSTRATE PROCESSING

CROSS-REFERENCE TO RELATED APPLICATIONS

This application claims priority under 35 U.S.C. § 119 to Korean Patent Application Nos. 10-2021-0193593 and 10-2022-0129378 filed on Dec. 31, 2021, and Oct. 11, 2022, respectively, in the Korean Intellectual Property Office, the disclosures of which are incorporated by reference herein in their entireties.

BACKGROUND

Embodiments of the present disclosure described herein relate to an apparatus and a method for inspecting an electrostatic chuck for substrate processing, and more particularly, relate to an apparatus and a method for inspecting an electrostatic chuck, capable of inspecting the electrostatic chuck using an ultrasonic wave.

In general, an electrostatic chuck (ESC) is used to adsorb an object, such as a substrate, using electrostatic force. The total electrostatic force ($F_{total}$) of the electrostatic chuck is represented by the sum of $F_{Coulomb}$ and Johnson-Labeckheem (FJ-R), where $F_{Coulomb}$ is expressed as in $\alpha*0.5*\varepsilon_1*\varepsilon_2*A_1*(V_1/D_1)_2$ ($\alpha$=constant, $\varepsilon_1$=vacuum dielectric constant, $\varepsilon_2$=the specific dielectric constant, A1=the area of a non-contact region, $V_1$=an applied voltage, and $D_1$=the thickness of a dielectric material), and Johnson-Labec force is expressed as in $\beta*0.5*\varepsilon_2*A_2*(V_2/D_2)2$ ($\beta$=constant, $\varepsilon_2$=vacuum dielectric constant, $A_2$=the area of a contact region, $V_2$=applied voltage, and $D_2$=the roughness of a ceramic surface).

In this case, when the resistance of the ceramic constituting the electrostatic chuck is 1E16 or higher, the Coulombic force forms force significantly larger than that of the Johnson-Labec force. Accordingly, the area (A2) of the contact region, in which the substrate is overlapped with the electrode, does not greatly exert an influence. Accordingly, the substrate is easily separated from the electrostatic chuck when the voltage of the electrode is turned off.

However, when the resistance of the ceramic constituting the electrostatic chuck is in the range of 1E9 to 1E13, the Johnson-Labec force is greatly increased. Accordingly, the area (A2) of the contact region, in which the substrate is overlapped with the electrode, greatly exerts an influence. Accordingly, the substrate is not easily separated from the electrostatic chuck, when the voltage of the electrode is turned off. In this case, when the diameter of the electrode is increased by 1 mm, the area ( ) of the contact region, in which the substrate is overlapped with the electrode, is increased by 10% or more. Accordingly, when the voltage of the electrode is turned off, the substrate is not separated from the electrostatic chuck.

Accordingly, when inspecting the electrostatic chuck, the area of the electrode should be inspected. However, according to the conventional method of inspecting the electrostatic chuck, the technical solution for inspecting the area of the electrode has not been suggested.

Meanwhile, among the non-destructive tests, there is an ultrasonic test method, which is used only to probe the inside of an object to examine cracks or pores generated inside the object. When the offset degree of the electrostatic chuck to the electrode, the area of the electrode, or the thickness of the electrode is calculated by the ultrasonic test method, the additional technical solution for the calculation is necessary.

SUMMARY

Embodiments of the present disclosure provide an apparatus and a method for inspecting an electrostatic chuck for substrate processing, capable of measuring an offset phenomenon of the electrostatic chuck to the electrode by using an ultrasonic wave when examining the electrostatic chuck.

Embodiments of the present disclosure provide an apparatus and a method for inspecting an electrostatic chuck for substrate processing, capable of measuring an area of an electrode of an electrostatic chuck by using an ultrasonic wave when inspecting the electrostatic chuck.

In addition, embodiments of the present disclosure provide an apparatus and a method for inspecting an electrostatic chuck for substrate processing, capable of measuring the thickness of an electrostatic chuck by using an ultrasonic wave when inspecting the electrostatic chuck.

According to an embodiment, an apparatus for inspecting an electrostatic chuck for substrate processing, includes the electrostatic chuck including a ceramic layer and an electrode layer coupled to an inside of the ceramic layer, an ultrasonic sensor unit disposed on the electrostatic chuck, allowing an ultrasonic wave to be incident into the electrostatic chuck, and converting a reflected signal reflected through the electrostatic chuck into an ultrasonic voltage signal, and an ultrasonic inspection unit configured to divide the ceramic layer and the electrode layer, based on a size value of the ultrasonic voltage signal.

According to an embodiment the ultrasonic inspection unit includes an image transforming unit electrically connected to the ultrasonic sensor unit to receive ultrasonic voltage signals for a whole region, which is to be inspected, of the electrostatic chuck from the ultrasonic sensor unit and to convert the ultrasonic voltage signals into ultrasonic image information.

According to an embodiment of the present disclosure, pixel values constituting the ultrasonic image information are set to have different brightness for levels of voltage amplitude sizes of the ultrasonic voltage signals.

According to an embodiment, the ultrasonic inspection unit further includes a scale converting unit to receive the ultrasonic image information of the electrostatic chuck by interworking with the image transforming unit to adjust a scale of the received ultrasonic image information of the electrostatic chuck, such that the scale of the ultrasonic image information of the electrostatic chuck is matched to an actual size of the electrostatic chuck.

According to an embodiment, the ultrasonic inspection unit further includes a non-overlap region extracting unit to receive the ultrasonic image information of the electrostatic chuck, which has an actual scale adjusted by interworking with the scale converting unit, and to extract a non-overlap region, in which the ceramic layer is not overlapped with the electrode layer, based on the received ultrasonic image information of the electrostatic chuck.

According to an embodiment, the ultrasonic inspection unit further includes an electrode-spacing calculating unit to receive pixel coordinate values for an inner boundary line and an outer boundary line of the non-overlap region by interworking with the non-overlap region extracting unit, to calculate a width between the inner boundary line and the outer boundary line, and to calculate a spacing between the ceramic layer and the electrode layer.

According to an embodiment, the ultrasonic inspection unit further includes an electrode-area calculating unit to receive the spacing by interworking with the electrode-spacing calculating unit, to subtract the spacing from a diameter value, which is previously measured, of the ceramic layer, in a state where the diameter value is stored, and to calculate an area of the electrode layer through a circular area formula (radius*circular circumference).

According to an embodiment, the ultrasonic inspection unit includes an electrode-thickness calculating unit to calculate a thickness of the electrode layer through following Equation 1, $$S_0 = 0.5 * V_1(t_1 - t_0) \qquad \text{Equation 1}$$

($S_0$=a thickness of the electrode layer, $V_1$=a sound velocity when an ultrasonic wave passes through the electrode layer, $t_1$=a time taken until an ultrasonic wave output from the ultrasonic sensor unit is reflected through the electrode layer, and $t_0$=a delay time for the measurement of the ultrasonic generator until an ultrasonic voltage signal is generated).

According to an embodiment, the ultrasonic sensor unit performs a probing operation by allowing a focus of the ultrasonic wave to be present on a surface of the ceramic layer, when the probing operation is performed.

According to an embodiment, the apparatus may further include an inspection water tank unit to receive a liquid medium such that the electrostatic chuck is immersed into the liquid medium.

According to an embodiment, the ultrasonic sensor unit is immersed into the liquid medium and disposed to be spaced apart from the electrostatic chuck.

According to an embodiment, a method for inspecting an electrostatic chuck for substrate processing, includes operating an ultrasonic sensor unit to output, in a form of voltage waveforms, a reflected wave, which is returned after an ultrasonic wave passes through an electrostatic chuck, as the ultrasonic sensor unit generates the ultrasonic wave, and generating an ultrasonic image by analyzing, by an image transforming unit, a size value of the voltage waveforms for a reflected signal, which is detected by the ultrasonic sensor unit, to generate the ultrasonic image information of the electrostatic chuck formed with a different brightness for each level for the size value of the voltage waveforms.

According to an embodiment, the method for inspecting the electrostatic chuck for substrate processing further includes adjusting, by a scale converting unit, a scale of the ultrasonic image to receive the ultrasonic image information of the electrostatic chuck by interworking with the image transforming unit to adjust a scale of the ultrasonic image information of the electrostatic chuck, such that the scale of the ultrasonic image information of the electrostatic chuck is matched to an actual size of the electrostatic chuck.

According to an embodiment the method for inspecting the electrostatic chuck for substrate processing further includes extracting, by a non-overlap region extracting unit, a non-overlap region by receiving the ultrasonic image information of the electrostatic chuck having the actual size adjusted by interworking with the scale converting unit, and performing a division work, such that regions having mutually different information in pixel brightness are divided in a region for the ultrasonic image information of the electrostatic chuck having the adjusted scale, calculating, by an electrode-spacing calculating unit, a spacing between non-overlap regions which are divided in the non-overlap region extracting unit, and subtracting the spacing from a diameter value, which is previously measured, of a ceramic layer, in a state where the diameter value is stored, to calculate an area of the electrode layer through a circular area formula.

According to an embodiment, the method for inspecting the electrostatic chuck for substrate processing further includes measuring, by an electrode-thickness calculating unit, an electrode layer from the ultrasonic sensor unit, to measure a time (t1) until the ultrasonic wave is reflected through the electrode layer, and to calculate a thickness of the electrode layer using following Equation 1 including the previously stored constant value, $$S_0 = 0.5 * V_1(t_1 - t_0) \qquad \text{Equation 1}$$

($S_0$=a thickness of the electrode layer, $V_1$=a sound velocity when an ultrasonic wave passes through the electrode layer, $t_1$=a time taken until an ultrasonic wave output from the ultrasonic sensor unit is reflected through the electrode layer, and $t_0$=a delay time for the measurement of the ultrasonic generator until an ultrasonic voltage signal is generated).

According to an embodiment, the method for inspecting the electrostatic chuck for substrate processing further includes, before driving the ultrasonic sensor unit, disposing a substrate by disposing the electrostatic chuck into an inspection water tank unit filled with a liquid medium.

According to an embodiment, in the method for inspecting the electrostatic chuck for substrate processing, the ultrasonic sensor unit is immersed into the liquid medium and disposed to be spaced apart from the electrostatic chuck, in the disposing of the substrate.

According to an embodiment, the method for inspecting the electrostatic chuck for substrate processing further includes, before driving the ultrasonic sensor unit, disposing the ultrasonic sensor unit by moving, by the scanning driving unit, the ultrasonic sensor unit to an inspection point on a preset driving command.

According to an embodiment, in the method for inspecting an electrostatic chuck for substrate processing, pixel values constituting the ultrasonic image information are set to have different brightness for levels of voltage amplitude sizes of the ultrasonic voltage signals.

According to an embodiment an apparatus for inspecting an electrostatic chuck for substrate processing, includes the electrostatic chuck including a ceramic layer and an electrode layer coupled to an inside of the ceramic layer, an ultrasonic sensor unit disposed on the electrostatic chuck, allowing an ultrasonic wave to be incident into the electrostatic chuck, and converting a reflected signal reflected through the electrostatic chuck into an ultrasonic voltage signal, and an ultrasonic inspection unit configured to divide the ceramic layer and the electrode layer, based on a size value of the ultrasonic voltage signal.

The ultrasonic inspection unit includes an image transforming unit electrically connected to the ultrasonic sensor unit to receive ultrasonic voltage signals for a whole region, which is to be inspected, of the electrostatic chuck from the ultrasonic sensor unit and to convert the ultrasonic voltage signals into ultrasonic image information.

Pixel values constituting the ultrasonic image information are set to have different brightness for levels of voltage amplitude sizes of the ultrasonic voltage signals.

The ultrasonic inspection unit further includes a scale converting unit to receive the ultrasonic image information of the electrostatic chuck by interworking with the image transforming unit to adjust a scale of the received ultrasonic image information of the electrostatic chuck, such that the scale of the ultrasonic image information of the electrostatic chuck is matched to an actual size of the electrostatic chuck.

The ultrasonic inspection unit further includes a non-overlap region extracting unit to receive the ultrasonic image information of the electrostatic chuck, which has an actual scale adjusted by interworking with the scale converting unit, and to extract a non-overlap region, in which the ceramic layer is not overlapped with the electrode layer, based on the received ultrasonic image information of the electrostatic chuck.

The ultrasonic inspection unit further includes an electrode-spacing calculating unit to receive pixel coordinate values for an inner boundary line and an outer boundary line of the non-overlap region by interworking with the non-overlap region extracting unit, to calculate a width between the inner boundary line and the outer boundary line, and to calculate a spacing between the ceramic layer and the electrode layer.

The ultrasonic inspection unit further includes an electrode-area calculating unit to receive the spacing by interworking with the electrode-spacing calculating unit, to subtract the spacing from a diameter value, which is previously measured, of the ceramic layer, in a state where the diameter value is stored, and to calculate an area of the electrode layer through a circular area formula (radius*circular circumference).

The ultrasonic inspection unit further includes an electrode-thickness calculating unit to calculate a thickness of the electrode layer through following Equation 1, $$S_0 = 0.5 * V_1(t_1 - t_0)$$ Equation 1

($S_0$=a thickness of the electrode layer, $V_1$=a sound velocity when an ultrasonic wave passes through the electrode layer, $t_1$=a time taken until an ultrasonic wave output from the ultrasonic sensor unit is reflected through the electrode layer, and $t_0$=a delay time for the measurement of the ultrasonic generator until an ultrasonic voltage signal is generated).

The ultrasonic sensor unit performs a probing operation by allowing a focus of the ultrasonic wave to be present on a surface of the ceramic layer, when the probing operation is performed.

The apparatus further includes an inspection water tank unit to receive a liquid medium such that the electrostatic chuck is immersed into the liquid medium.

The ultrasonic sensor unit is immersed into the liquid medium and disposed to be spaced apart from the electrostatic chuck.

BRIEF DESCRIPTION OF THE FIGURES

The above and other objects and features of the present disclosure will become apparent by describing in detail embodiments thereof with reference to the accompanying drawings.

DETAILED DESCRIPTION

Hereinafter, embodiments of the present disclosure will be described with reference to accompanying drawings. In the following description, when a certain part "includes" a certain component, the certain part does not exclude other components, but may further include other components if there is a specific opposite description. In addition, terms such as "unit" refer to units that perform at least one function or operation, and is regarded as one part, function, use, point, or driving component in the description of a machine apparatus. In addition, in the following description, the same component or the similar component will be assigned with the same reference numeral, and the duplication of the description of the same reference numeral will be omitted to avoid redundancy.

Figure 1:
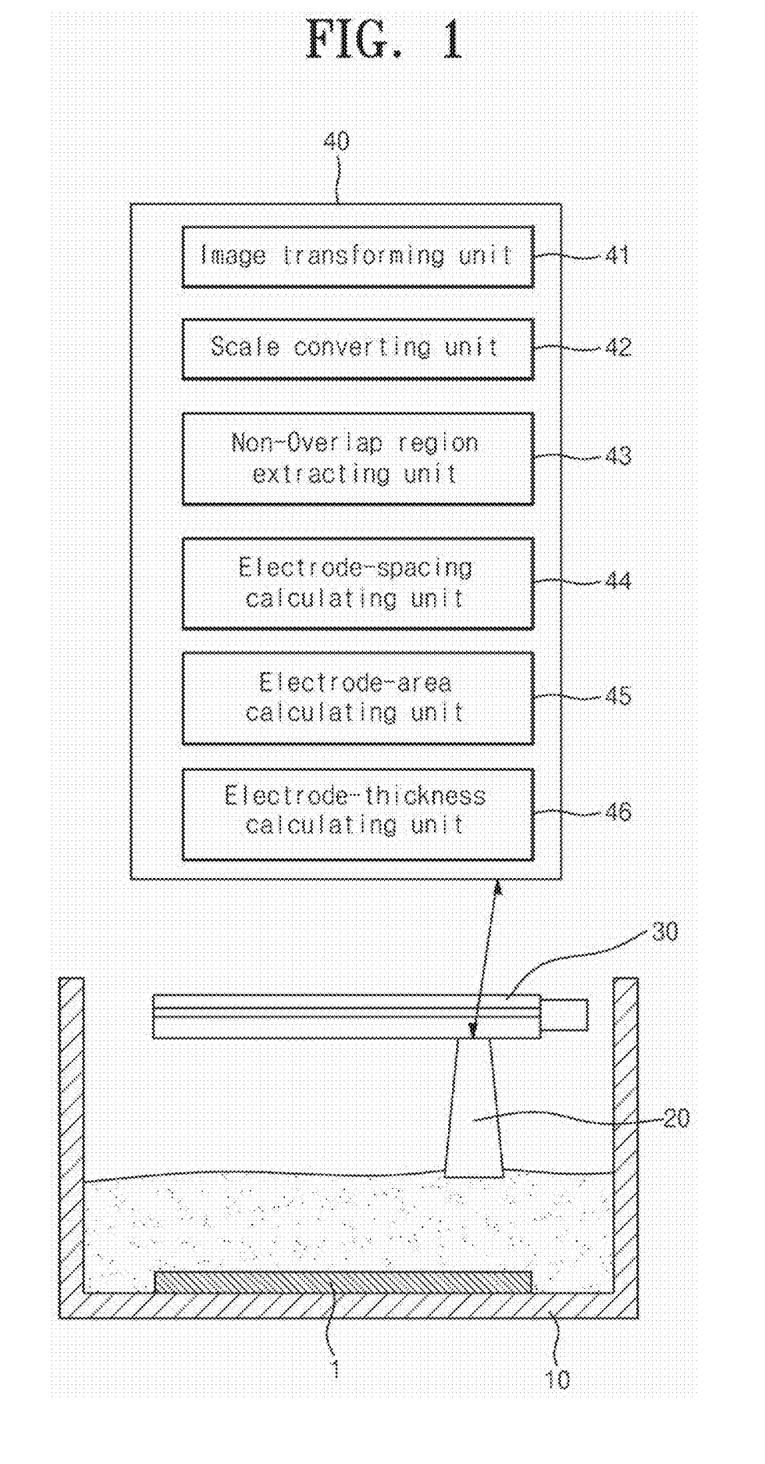
FIG. 1 is a block diagram illustrating an apparatus for inspecting an electrostatic chuck for substrate processing according to an embodiment of the present disclosure.
Figure 2:
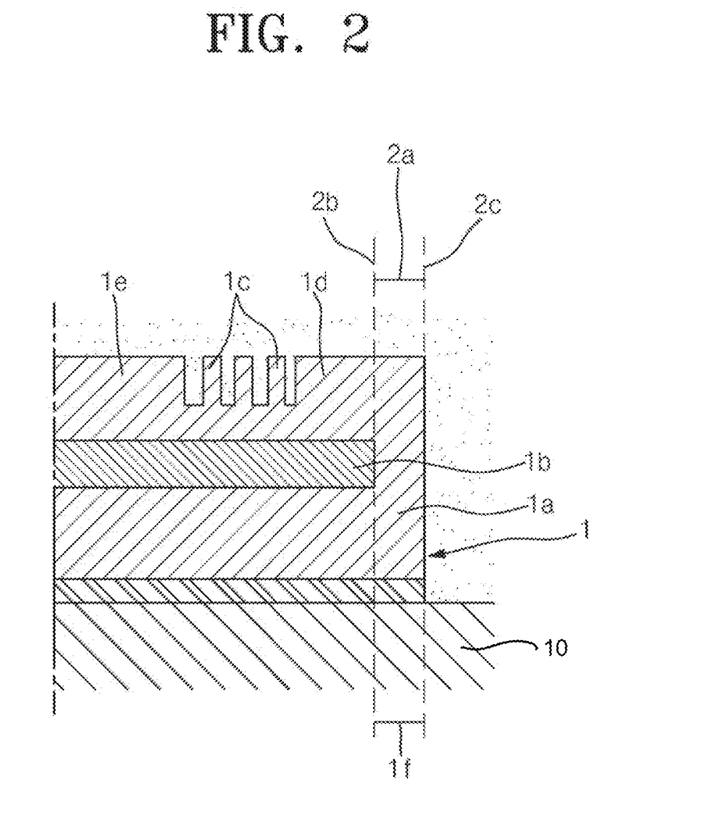
FIG. 2 is a partial cross-sectional view of an enlarged region, which is to be inspected, of the electrostatic chuck illustrated in FIG. 1.
Figure 3:
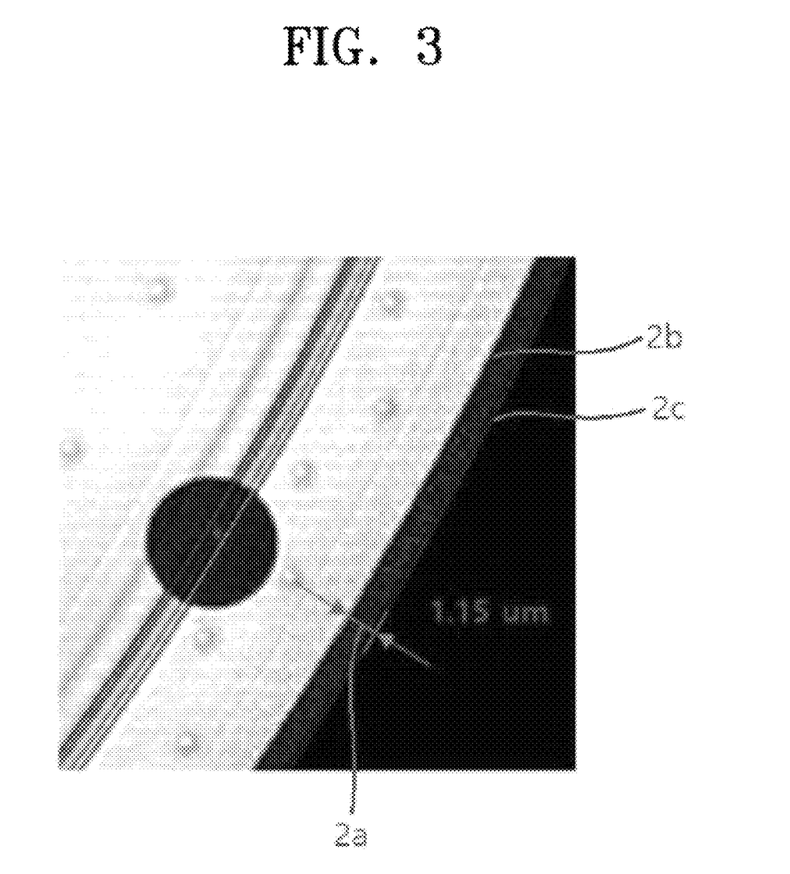
FIG. 3 is a photography illustrating an image an electrostatic chuck photographed by using an ultrasonic image processing unit illustrated in FIG. 1.
Figure 4:
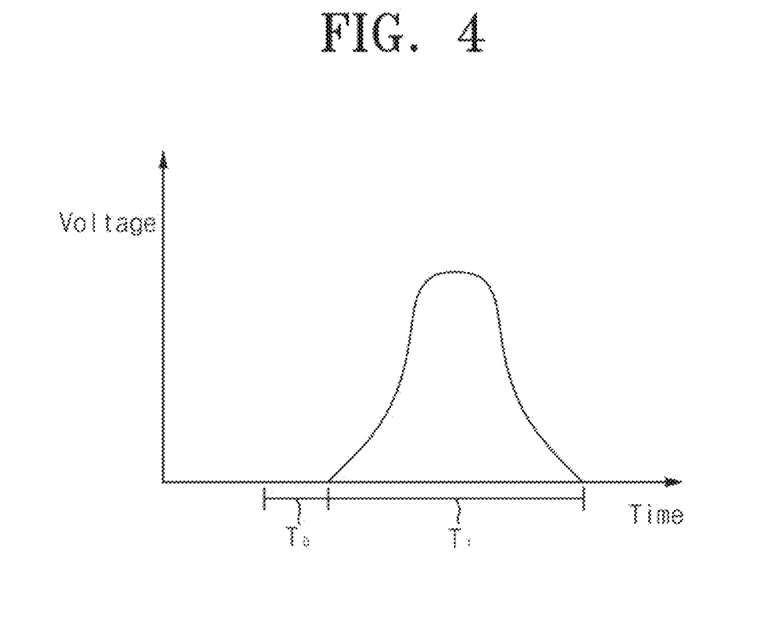
FIG. 4 is a voltage waveform of a reflected wave measured when an ultrasonic sensor unit inspects an electrode layer of an electrostatic chuck using an ultrasonic wave.

FIG. 1 is a block diagram illustrating an apparatus for inspecting an electrostatic chuck according to an embodiment of the present disclosure. FIG. 2 is a partial cross-sectional view of an enlarged region, which is to be inspected, of the electrostatic chuck illustrated in FIG. 1. FIG. 3 is a photography illustrating an image of an electrostatic chuck photographed by using an ultrasonic image processing unit illustrated in FIG. 1. FIG. 4 is a voltage waveform of a reflected wave measured when an ultrasonic sensor unit inspects an electrode layer of an electrostatic chuck using an ultrasonic wave.

As illustrated in FIG. 1, the apparatus for inspecting the electrostatic chuck for substrate processing according to an embodiment of the present disclosure includes an inspection water tank unit 10, an ultrasonic sensor unit 20, a scanning driving unit 30, and an ultrasonic inspection unit 40.

The inspection water tank unit 10 is formed in a water tank form having an upper portion which is open, and an electrostatic chuck 1 is disposed on an inner bottom surface of the inspection water tank unit 10. In this case, a liquid medium is received in the inspection water tank unit 10. In this case, the liquid medium may include water, and may include another liquid medium, if necessary. As described above, the inspection tank unit 10 is provided such that a probe of the ultrasonic sensor unit 20 is immersed into the liquid medium in the state that the electrostatic chuck 1 is immersed in the liquid medium, but the electrostatic chuck 1 is prevented from directly making contact with the ultrasonic sensor unit 20. Accordingly, the ultrasonic sensor unit 20 may easily transmit an ultrasonic wave to the electrostatic chuck 1 through the liquid medium when the electrostatic chuck 1 is inspected by using ultrasonic waves. In addition, as the ultrasonic sensor unit 20 is prevented from directly making contact with the electrostatic chuck 1, the electrostatic chuck 1 is prevented from being scratched through the direction contact between the ultrasonic sensor unit 20 and the electrostatic chuck 1. In this case, the electrostatic chuck 1 disposed inside the inspection water tank unit 10 is an electrostatic chuck 1 which adsorbs a substrate, such as a wafer, by electrostatic force. According to the present embodiment, the electrostatic chuck 1 includes a ceramic layer 1a formed of ceramic, an electrode layer 1b inserted into the ceramic layer 1a, and an adhesive layer formed under the electrode layer 1b and bonded to an alumina layer not illustrated in the drawing. In this case, the ceramic layer 1a has an embossed part 1c formed on the top surface thereof, an outer dam region 1d is formed on the outside of the outermost portion of the embossed part 1c, and an inner dam region 1e is formed on the inside of the outermost embossed part 1c.

The ultrasonic sensor unit 20 is disposed in an upper portion of the inspection water tank unit 10, and a lower end portion of the ultrasonic sensor unit 20 is inserted into the liquid medium. In this case, the ultrasonic sensor unit 20 includes an ultrasonic pulser (not illustrated), which generates an ultrasonic wave, and an ultrasonic receiver (not illustrated) which receives a reflected wave obtained, as the ultrasonic wave generated from the ultrasonic pulser passes through the electrostatic chuck 1 and reflected. In addition, the ultrasonic sensor unit 20 is mounted together with a scanning driving unit 30, moves on a preset driving command of the scanning driving unit 30 while allowing an ultrasonic wave to be incident into the electrostatic chuck 1 and receiving a reflected wave, and converts the reflected signal into an ultrasonic wave voltage signal. In this case, the ultrasonic sensor unit 20 performs an ultrasonic scanning operation to obtain an ultrasonic voltage signal throughout the whole region, which is to be inspected, of the electrostatic chuck 1, thereby securing an ultrasonic voltage signal for each a micro-area of the entire plane of the region to be inspected. As described above, the ultrasonic sensor unit 20 detects the ceramic layer 1a and the electrode layer 1b of the electrostatic chuck through the principle in which an output voltage is changed, when the density of the ceramic is different from the density of the electrode. In this case, the ultrasonic sensor unit 20 has an ultrasonic frequency ranging from 50 MHz to 100 MHz, and performs the probing operation by allowing the focus of the ultrasonic wave to be present on the surface of the ceramic layer 1a, such that the ceramic layer 1a is distinguished from the electrodes 1b with the higher probability, when the probing operation is performed.

The scanning driving unit 30 is configured as a multi-freedom transfer device, and configured to have the ultrasonic sensor unit 20 provided at one end thereof. In this case, the scanning driving unit 30 moves the ultrasonic sensor unit 20 while moving on the preset driving command. The scanning driving unit 30 fixes the ultrasonic sensor unit 20 to prevent the ultrasonic sensor unit 20 from meeting the electrostatic chuck 1, such that the electrostatic chuck 1 is not scratched, and moves the ultrasonic sensor unit 20 to the present position, such that an exact ultrasonic wave image is ensured in inspection using the ultrasonic wave.

The ultrasonic inspection unit 40 includes an image transforming unit 41, a scale converting unit 42, a non-overlap region extracting unit 43, an electrode-spacing calculating unit 44, an electrode-area calculating unit 45, and an electrode-thickness calculating unit 46.

The image transforming unit 41 is electrically connected to the ultrasonic sensor unit 20, and receives ultrasonic voltage signals for the whole region, which is to be inspected, of the electrostatic chuck 1 from the ultrasonic sensor unit 20 and converts the ultrasonic voltage signal into ultrasonic image information. In this case, the ultrasonic image information includes ultrasonic image information of the electrostatic chuck 1 as illustrated in FIG. 3. In this case, when converting an ultrasonic signal into ultrasonic image information, the image transforming unit 41 is formed such that the pixel values constituting the ultrasonic image information have different brightness level information depending on the voltage amplitude of the ultrasonic voltage signal. Accordingly, the image transforming unit 41 previously stores a brightness information table having the information on 256 brightness levels divided depending on the amplitude of the voltage, determines brightness level information, which is matched to the size of a voltage amplitude of the ultrasonic voltage signal, in the brightness information table, and outputs the brightness level information corresponding to the size of the voltage amplitude as pixel information. In this case, the brightness level information may output pixel information having brightness increased, as the level is increased. However, according to present disclosure, the brightness information is not limited to the above-described 256 levels. For example, if necessary, the levels of the brightness may be adjusted.

The scale converting unit 42 receives the ultrasonic image information of the electrostatic chuck 1 by interworking with the image transforming unit 41, and adjusts the scale of the ultrasonic image information of the electrostatic chuck 1, such that the ultrasonic image information of the electrostatic chuck is matched to the actual size of the electrostatic chuck 1. In this case, the scale converting unit 42 may adjust a grid coordinate value of each pixel of the ultrasonic image information of the electrostatic chuck 1 to be matched to the actual size of the electrostatic chuck 1.

The non-overlap region extracting unit 43 receives the ultrasonic image information of the electrostatic chuck 1, which has the actual scale adjusted by interworking with the scale converting unit 42, and extracts a non-overlap region 1f, in which the ceramic layer 1a is not overlapped with the electrode layer 1b, based on the received ultrasonic image information of the electrostatic chuck 1. More specifically, the non-overlap region extracting unit 43 receives the ultrasonic image information of the electrostatic chuck 1 adjusted to the actual scale by interworking with the scale converting unit 42, and performs a division work, such that regions having mutually different information in pixel brightness are divided in a region for the ultrasonic image information of the electrostatic chuck 1 having the adjusted scale. In this case, regarding regions having mutually different information in pixel brightness information, the overlap region between the ceramic layer 1a and the electrode layer 1b is formed to have a specific brightness or more, in the ultrasonic image information having the scale adjusted by the scale converting unit 42. In this case, a non-overlap region in which the ceramic layer 1a is not overlapped with the electrode layer 1b is formed to have information on lower brightness, but information on brightness higher than that of a black color. In addition, a medium region having only a medium without the ceramic layer 1a and the electrode layer 1b is formed in a black color.

The electrode-spacing calculating unit 44 receives pixel coordinate values for the inner boundary line 2b and outer boundary line 2c of the non-overlap region 1f by interworking the non-overlap region extracting unit 43, calculates the widths between the inner boundary line 2b and the outer boundary line 2c, and calculates the spacing 2a between the ceramic layer 1a and the electrode layer 1b. According to the present embodiment, the spacing 2a of the non-overlap region 1f is formed to be 1.15 μm as illustrated in the drawing. As described above, for example, the electrode-spacing calculating unit 44 may receive pixel coordinate values for the inner boundary line 2b and outer boundary line 2c of the non-overlap region 1f by interworking with the non-overlap region extracting unit 43, and may calculate the distance between an inner interconnection point between a virtual line and the inner boundary line 2b, and an outer interconnection point between the virtual line and the outer boundary line 2c, on the assumption that the virtual line extends from the central point of the electrostatic chuck 1 to an outer circumferential side of the electrostatic chuck 1. As the virtual line is generated for each angle in such a manner, the whole spacings 2a between the outer boundary line 2c and the inner boundary line 2b of the electrode layer 1b may be calculated In this case, the electrostatic chuck tester may recognize the extent the electrode layer 1b is spaced apart from the ceramic layer 1a, based on the spacing 2a. Accordingly, it may be determined whether the electrode layer 1b is spaced apart from the ceramic layer 1a beyond a specific deviation, thereby determining whether the electrode layer 1b is offset.

The electrode-area calculating unit 45 receives the spacing 2a by interworking with the electrode-spacing calculating unit 44, subtracts the spacing 2a from a diameter value of the ceramic layer 1a in the state where the measured diameter value is stored, and calculates the area of the electrode layer 1b through a circular area formula (radius*circular circumference). In this case, when the calculated area of the electrode layer 1b exceeds the preset reference area value, the electrode-area calculating unit 45 determines that the electrostatic chuck 1 is defective and outputs a defective alarm to more efficiently inspect the electrostatic chuck 1, when inspecting the electrostatic chuck 1.

The electrode-thickness calculating unit 46, which is a component to calculate the thickness of the electrode layer 1b, may calculate the thickness of the electrode layer 1b through following Equation 1.

$$S_0 = 0.5 * V_1 (t_1 - t_0)$$ Equation 1

($S_0$=the thickness of the electrode layer 1b, $V_1$=a sound velocity when an ultrasonic wave passes through the electrode layer 1b, $t_1$=time taken until an ultrasonic wave output from the ultrasonic sensor unit 20 is reflected through the electrode layer 1b, and $t_0$=a delay time for the measurement of the ultrasonic generator until an ultrasonic voltage signal is generated).

In this case, $V_1$, $t_1$, and $t_0$ are values measured through experiments and are values stored in the electrode-thickness calculating unit 46.

The electrode-thickness calculating unit 46 receives the time t1 taken until the ultrasonic wave is reflected through the electrode layer 1b, through the measurement of the electrode layer 1b by the ultrasonic sensor unit 20 as illustrated in FIG. 4, such that the area of the electrode layer 1b is calculated through Equation 1. In this case, the ultrasonic sensor unit 20 is disposed to make the focus on the top surface of the electrode layer 1b to measure the thickness of the electrode layer 1b. Next, the electrode-thickness calculating unit 46 calculates the thickness $S_0$ of the electrode layer 1b by substituting the sound velocity $V_1$ of the ultrasonic wave passing through the electrode layer 1b, which is a pre-stored value by the experiment, and the measurement delay time to of the ultrasonic sensor unit.

Hereinafter, a method for inspecting an electrostatic chuck for substrate processing by using the apparatus for inspecting the electrostatic chuck for substrate processing will be described according to an embodiment of the present disclosure.

Figure 5:
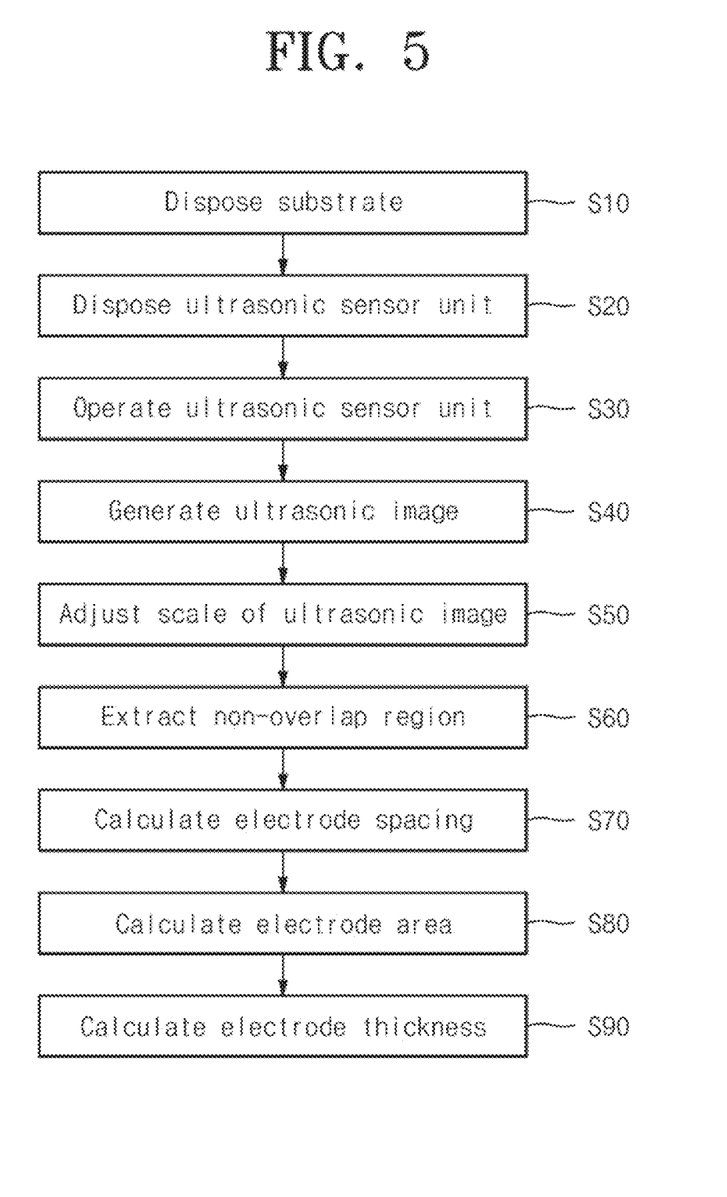
FIG. 5 is a flowchart of a method for inspecting an electrostatic chuck for substrate processing according to an embodiment of the present disclosure.

FIG. 5 is a flowchart of a method for inspecting an electrostatic chuck for substrate processing according to an embodiment of the present disclosure.

As illustrated in FIG. 5, the apparatus for inspecting an electrostatic chuck for substrate process according to one embodiment of present disclosure includes the steps of disposing a substrate (S10), disposing an ultrasonic sensor unit (S20), operating an ultrasonic sensor unit (S30), generating an ultrasonic image (S40), adjusting the scale of an ultrasonic image (S50), extracting non-overlap region (S60), calculating electrode spacing (S70), calculating an electrode area (S80), and calculating an electrode thickness (S90).

First, in the step of disposing a substrate (S10), the ceramic layer 1a provided therein with the electrode layer 1b in the electrostatic chuck 1 is placed in the inspection water tank unit 10 filled with a liquid medium.

Next, in the step of disposing the ultrasonic sensor unit (S20), the scanning driving unit 30 moves the ultrasonic sensor unit 20 to the inspection point on the preset driving command Next, in the step of operating the ultrasonic sensor unit (S30), a reflected wave, which is returned after passing through the electrostatic chuck, as the ultrasonic sensor unit generates an ultrasonic wave, is output in the form of voltage waveforms.

Next, in the step of generating the ultrasonic image (S40), the image transforming unit 41 analyzes the size value of the voltage waveforms for the reflected signal detected by the ultrasonic sensor unit 20 to generate ultrasonic image information of the electrostatic chuck 1 formed with different brightness for each of levels for size values of the voltage waveforms.

Then, in the step of adjusting the scale of an ultrasonic image (S50), the scale converting unit 42 receives the ultrasonic image information of the electrostatic chuck 1 by interworking with the image transforming unit 41, and adjusts the scale of the ultrasonic image information of the electrostatic chuck 1 to be matched to the actual size of the electrostatic chuck 1.

Subsequently, in the step of extracting non-overlap region (S60), the non-overlap region extracting unit 43 receives the ultrasonic image information of the electrostatic chuck 1 having an actual size adjusted by interworking with the scale converting unit 42, and performs a division work, such that regions having mutually different information in pixel brightness are divided in a region for the ultrasonic image information of the electrostatic chuck 1 having the adjusted scale.

Then, in the step of calculating electrode spacing (S70), the electrode-spacing calculating unit 44 calculates the spacing 2a between the non-overlap regions if which are divided in the non-overlap region extracting unit 43. In this case, in the step of calculating electrode spacing (S70), the electrode-spacing calculating unit 44 may calculate the spacing 2a of the electrode layer by numerically interpolating the boundary line between the non-overlap regions if as described above.

Thereafter, in the step of calculating the electrode area (S80), after subtracting the spacing 2a from a diameter value of the ceramic layer 1a in the state where the previously measured diameter value of the ceramic layer 1a is stored, the area of the electrode layer 1b is calculated through a circular area formula (radius*circular circumference). In this case, in the step of calculating the electrode area (S80), when the calculated area of the electrode layer 1b exceeds the preset reference area value, the electrode-area calculating unit 45 determines that the electrostatic chuck 1 is defective and outputs a defective alarm to more efficiently inspect the electrostatic chuck 1, when inspecting the electrostatic chuck 1.

Next, in the step of calculating the electrode thickness (S90), the electrode-thickness calculating unit 46 measures the electrode layer 1b from the ultrasonic sensor unit 20, measures the time t1 until the ultrasonic wave is reflected through the electrode layer 1b, and calculates the thickness S0 of the electrode layer 1b using Equation 1 including the previously stored constant value.

As described above, in the apparatus and the method for inspecting an electrostatic chuck according to an embodiment of the present disclosure, since the spacing $2a$ of the electrode layer $1b$ is calculated, the offset phenomenon of the electrostatic chuck 1 may be measured.

As described above, in the apparatus and the method for inspecting an electrostatic chuck according to an embodiment of the present disclosure, the area of the electrostatic chuck 1 may be measured through the spacing $2a$ of the front layer.

In addition, according to an embodiment of the present disclosure, in the apparatus and the method for inspecting the electrostatic chuck for substrate processing, the thickness of the electrostatic chuck 1 may be measured by using the ultrasonic wave.

According to the present disclosure, since the spacing of the electrode layer is calculated, the offset phenomenon of the electrode of the electrostatic chuck may be measured.

In addition, according to the present disclosure, the area of the electrostatic chuck may be measured based on the spacing of the electrode layer.

In addition, according to the present disclosure, the thickness of the electrostatic chuck may be measured by using the ultrasonic wave, when inspecting the electrostatic chuck.

Hereinabove, although the present disclosure has been described with reference to embodiments and the accompanying drawings, the present disclosure is not limited thereto, but may be variously modified and altered by those skilled in the art to which the present disclosure pertains without departing from the spirit and scope of the present disclosure claimed in the following claims.

While the spirit of the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An apparatus for inspecting an electrostatic chuck for substrate processing, the apparatus comprising:
    an electrostatic chuck including a ceramic layer and an electrode layer coupled to an inside of the ceramic layer;
    an ultrasonic sensor unit disposed on the electrostatic chuck, configured to allow an ultrasonic wave to be incident into the electrostatic chuck, and configured to convert a reflected signal reflected through the electrostatic chuck into an ultrasonic voltage signal; and
    an ultrasonic inspection unit configured to divide the ceramic layer and the electrode layer, based on a voltage amplitude of the ultrasonic voltage signal.

2. The apparatus of claim 1, wherein the ultrasonic inspection unit includes:
    an image transforming unit electrically connected to the ultrasonic sensor unit to receive ultrasonic voltage signals for a whole region, which is to be inspected, of the electrostatic chuck from the ultrasonic sensor unit and to convert the ultrasonic voltage signals into ultrasonic image information.

3. The apparatus of claim 2, wherein pixel values constituting the ultrasonic image information are set to have different brightness for levels of voltage amplitude sizes of the ultrasonic voltage signals.

4. The apparatus of claim 2, wherein the ultrasonic inspection unit further includes:
    a scale converting unit to receive the ultrasonic image information of the electrostatic chuck by interworking with the image transforming unit to adjust a scale of the received ultrasonic image information of the electrostatic chuck, such that the scale of the ultrasonic image information of the electrostatic chuck is matched to an actual size of the electrostatic chuck.

5. The apparatus of claim 4, wherein the ultrasonic inspection unit further includes:
    a non-overlap region extracting unit to receive the ultrasonic image information of the electrostatic chuck, which has an actual scale adjusted by interworking with the scale converting unit, and to extract a non-overlap region, in which the ceramic layer is not overlapped with the electrode layer, based on the received ultrasonic image information of the electrostatic chuck.

6. The apparatus of claim 5, wherein the ultrasonic inspection unit further includes:
    an electrode-spacing calculating unit to receive pixel coordinate values for an inner boundary line and an outer boundary line of the non-overlap region by interworking with the non-overlap region extracting unit, to calculate a width between the inner boundary line and the outer boundary line, and to calculate a spacing between the ceramic layer and the electrode layer.

7. The apparatus of claim 6, wherein the ultrasonic inspection unit further includes:
    an electrode-area calculating unit to receive the spacing by interworking with the electrode-spacing calculating unit, to subtract the spacing from a diameter value, which is previously measured, of the ceramic layer, in a state where the diameter value is stored, and to calculate an area of the electrode layer through a circular area formula (radius*circular circumference).

8. The apparatus of claim 1, wherein the ultrasonic inspection unit includes:
    an electrode-thickness calculating unit to calculate a thickness of the electrode layer through following equation 1, $$S_0 = 0.5 * V_1(t_1 - t_0) \qquad \text{Equation 1}$$

($S_0$=a thickness of the electrode layer, $V_1$=a sound velocity when an ultrasonic wave passes through the electrode layer, $t_1$=a time taken until an ultrasonic wave output from the ultrasonic sensor unit is reflected through the electrode layer, and $t_0$=a delay time for measurement of an ultrasonic generator until an ultrasonic voltage signal is generated).

9. The apparatus of claim 1, wherein the ultrasonic sensor unit performs a probing operation by allowing a focus of the ultrasonic wave to be present on a surface of the ceramic layer, when the probing operation is performed.

10. The apparatus of claim 1, further comprising:
    an inspection water tank unit to receive a liquid medium such that the electrostatic chuck is immersed into the liquid medium.

11. The apparatus of claim 10, wherein the ultrasonic sensor unit is immersed into the liquid medium and disposed to be spaced apart from the electrostatic chuck.

12. An apparatus for inspecting an electrostatic chuck for substrate processing, the apparatus comprising:
    an electrostatic chuck including a ceramic layer and an electrode layer coupled to an inside of the ceramic layer;
    an ultrasonic sensor unit disposed on the electrostatic chuck, and configured to an ultrasonic wave to be incident into the electrostatic chuck, and to convert a reflected signal reflected through the electrostatic chuck into an ultrasonic voltage signal; and an ultrasonic inspection unit configured to divide the ceramic layer and the electrode layer, based on a voltage amplitude of the ultrasonic voltage signal, wherein the ultrasonic inspection unit includes:

an image transforming unit electrically connected to the ultrasonic sensor unit to receive ultrasonic voltage signals for a whole region, which is to be inspected, of the electrostatic chuck from the ultrasonic sensor unit and to convert the ultrasonic voltage signals into ultrasonic image information, wherein pixel values constituting the ultrasonic image information are set to have different brightness for levels of voltage amplitude sizes of the ultrasonic voltage signals, wherein the ultrasonic inspection unit further includes:

a scale converting unit to receive the ultrasonic image information of the electrostatic chuck by interworking with the image transforming unit to adjust a scale of the received ultrasonic image information of the electrostatic chuck, such that the scale of the ultrasonic image information of the electrostatic chuck is matched to an actual size of the electrostatic chuck, wherein the ultrasonic inspection unit further includes:

a non-overlap region extracting unit to receive the ultrasonic image information of the electrostatic chuck, which has an actual scale adjusted by interworking with the scale converting unit, and to extract a non-overlap region, in which the ceramic layer is not overlapped with the electrode layer, based on the received ultrasonic image information of the electrostatic chuck, wherein the ultrasonic inspection unit further includes:

an electrode-spacing calculating unit to receive pixel coordinate values for an inner boundary line and an outer boundary line of the non-overlap region by interworking with the non-overlap region extracting unit, to calculate a width between the inner boundary line and the outer boundary line, and to calculate a spacing between the ceramic layer and the electrode layer, wherein the ultrasonic inspection unit further includes:

an electrode-area calculating unit to receive the spacing by interworking with the electrode-spacing calculating unit, to subtract the spacing from a diameter value, which is previously measured, of the ceramic layer, in a state where the diameter value is stored, and to calculate an area of the electrode layer through a circular area formula (radius*circular circumference), wherein the ultrasonic inspection unit further includes:

an electrode-thickness calculating unit to calculate a thickness of the electrode layer through following Equation 1, $$S_0 = 0.5 * V_1(t_1-t_0) \qquad \text{Equation 1}$$

($S_0$=a thickness of the electrode layer, $V_1$=a sound velocity when an ultrasonic wave passes through the electrode layer, $t_1$=a time taken until an ultrasonic wave output from the ultrasonic sensor unit is reflected through the electrode layer, and $t_0$=a delay time for measurement of an ultrasonic generator until an ultrasonic voltage signal is generated), wherein the ultrasonic sensor unit performs a probing operation by allowing a focus of the ultrasonic wave to be present on a surface of the ceramic layer, when the probing operation is performed, wherein the apparatus further includes:

an inspection water tank unit to receive a liquid medium such that the electrostatic chuck is immersed into the liquid medium, and wherein the ultrasonic sensor unit is immersed into the liquid medium and disposed to be spaced apart from the electrostatic chuck.

* * * * *